(12) United States Patent
Jaycox et al.

(10) Patent No.: US 7,402,342 B2
(45) Date of Patent: Jul. 22, 2008

(54) HOLE TRANSPORT POLYMERS AND DEVICES MADE WITH SUCH POLYMERS

(75) Inventors: Gary Delmar Jaycox, West Chester, PA (US); Mookkan Periyasamy, Wilmington, DE (US); Gang Yu, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 127 days.

(21) Appl. No.: 11/035,577

(22) Filed: Jan. 14, 2005

(65) Prior Publication Data

US 2005/0131185 A1 Jun. 16, 2005

Related U.S. Application Data

(62) Division of application No. 10/396,181, filed on Mar. 25, 2003, now Pat. No. 7,205,366.

(60) Provisional application No. 60/369,663, filed on Apr. 2, 2002.

(51) Int. Cl.
*B32B 15/08* (2006.01)
*B32B 27/30* (2006.01)

(52) U.S. Cl. .................. 428/432; 428/461; 428/521; 526/285

(58) Field of Classification Search .......... 428/432, 428/461, 521; 526/285
See application file for complete search history.

(56) References Cited

U.S. PATENT DOCUMENTS

| | | |
|---|---|---|
| 4,008,083 A | 2/1977 | Pye |
| 4,356,429 A | 10/1982 | Tang |
| 4,468,509 A | 8/1984 | Naarmann et al. |
| 4,539,507 A | 9/1985 | VanSlyke et al. |
| 4,552,927 A | 11/1985 | Warren |
| 4,959,430 A | 9/1990 | Jonas et al. |
| 5,024,791 A | 6/1991 | Cusano et al. |
| 5,247,190 A | 9/1993 | Friend et al. |
| 5,286,413 A | 2/1994 | Hannecart et al. |
| 5,300,575 A | 4/1994 | Jonas et al. |
| 5,305,126 A | 4/1994 | Kobayashi et al. |
| 5,317,169 A | 5/1994 | Nakano et al. |
| 5,378,402 A | 1/1995 | Cross et al. |
| 5,408,109 A | 4/1995 | Heeger et al. |
| 5,609,970 A | 3/1997 | Kolb et al. |
| 5,653,914 A | 8/1997 | Holmes et al. |
| 5,705,888 A | 1/1998 | Staring et al. |
| 5,986,400 A | 11/1999 | Staring et al. |
| 5,994,496 A | 11/1999 | Van Haare et al. |
| 6,007,928 A | 12/1999 | Sakakibara et al. |
| 2001/0019782 A1 | 9/2001 | Igarashi et al. |
| 2005/0124732 A1 | 6/2005 | Jaycox et al. |

FOREIGN PATENT DOCUMENTS

| | | | |
|---|---|---|---|
| EP | 0 440 957 B1 | | 3/1996 |
| FR | 2 785 615 A1 | * | 5/2000 |
| GB | 2 124 635 A | | 2/1984 |
| WO | WO 00/70655 A2 | | 11/2000 |
| WO | WO 01/41512 A1 | | 6/2001 |
| WO | WO 01/44403 A1 | | 6/2001 |

OTHER PUBLICATIONS

Hummelen, Jan C. et. al., Preparation and Characterization of Fulleroid and Methanofullerene Derivatives, J. Org.Chem., 1995, 532-538, 60.
Yu G. et. al., Optocoupler Made From Semiconducting Polymers, Journal of Electronic Materials, 1994, 925-926, vol. 23, No. 9.
Johansson, D. Mikael et. al., Synthesis and Characterization of Highly Soluble Phenyl-Substituted Poly(Phenylenevinylenes), Macromolecules, 2000, 2525-2529, 33, American Chemical Society.
A. J. Sharpe, Jr. et al., Improved Cationic Conductive Polymer, Calgon Corp., Pittsburgh, PA, Coating Conference [Proceedings], pp. 83-87, 1981, ISSN 0364-2771.

* cited by examiner

*Primary Examiner*—Helen L. Pezzuto

(57) ABSTRACT

The present invention is generally directed to a hole transport polymer comprising a polymeric backbone having linked thereto a plurality of substituents comprising fused aromatic ring groups, with the proviso that the polymer does not contain groups selected from triarylamines and carbazole groups. It further relates to devices that are made with the polymer.

7 Claims, 3 Drawing Sheets

HOLE TRANSPORT POLYMERS AND DEVICES MADE WITH SUCH POLYMERS

This application is a Division of U.S. patent application Ser. No. 10/396,181, filed Mar. 25, 2003, now U.S. Pat. No. 7,205,366, which claims benefit from provisional application 60/369,663, filed on Apr. 2, 2002.

BACKGROUND OF THE INVENTION

1. Field of the Invention

This invention relates to polymeric materials having useful hole transport properties. The polymers can also be electroluminescent. The invention further relates to electronic devices in which the active layer includes such polymeric materials.

2. Description of the Related Art

Organic electronic devices that emit light, such as light-emitting diodes that make up displays, are present in many different kinds of electronic equipment. In such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components. Polymeric materials with stilbenyl or oxadiazole side chains have been reported by Holmes et al., U.S. Pat. No. 5,653,914.

Many electroluminescent materials have poor charge transport properties. To improve these properties additional charge transport materials can be added to the light-emitting layer, or as a separate layer between the light-emitting layer and an electrode. Hole transport materials have frequently been employed. Known hole transport materials include simple molecules such as N,N'-diphenyl-N,N'-bis(3-methylphenyl)-[1,1'-biphenyl]4,4'-diamine (TPD) and bis[4-(N,N-diethylamino)-2-methylphenyl](4-methylphenyl)methane (MPMP), and polymeric materials such as polyvinylcarbazole (PVK), (phenylmethyl)polysilane, poly (3,4-ethylenedioxythiophene) (PEDOT), and polyaniline (PANI). It is also known to use electron and hole transporting materials such as 4,4'-N,N'-dicarbazole biphenyl (BCP); or light-emitting materials with good electron and hole transport properties, such as chelated oxinoid compounds, such as tris (8-hydroxyquinolato)aluminum ($Alq_3$). Fused aromatic ring compounds such as pentacene are known to be electron transport materials. Copolymers having two different pendant aromatic groups have been disclosed as light-emitting materials in U.S. Pat. No. 6,007,928.

There is a continuing need for new hole transport materials.

SUMMARY OF THE INVENTION

The present invention is directed to a hole transport polymer including a polymeric backbone having linked thereto a plurality of substituents that includes at least one fused aromatic ring group, with the proviso that the polymer does not contain groups selected from triarylamines and carbazole groups.

The invention is further directed to an organic electronic device having an active layer between an anode and a cathode, wherein the device further has at least one first hole transport polymer that includes a polymeric backbone having linked thereto a plurality of substituents including at least one fused aromatic ring group, with the proviso that the polymer does not contain groups selected from triarylamines and carbazole groups.

As used herein, the term "hole transport material" is intended to mean material that can receive a positive charge from the anode and move it through the thickness of the material with relatively high efficiency and small loss. The term "hole transport polymer" is intended to mean polymeric hole transport material. The term "polymer" is intended to include homopolymers as well as copolymers having two or more different repeating units. The term "functionalized polymer" is intended to mean a polymer having at least one functional group(s) capable of reacting to attach a fused aromatic ring group to the polymer backbone. The term "functionalized fused aromatic ring compound" is intended to mean a fused aromatic ring compound having at least one functional group(s) capable of reacting to attach to the polymer backbone. The term "photoactive" refers to any material that exhibits electroluminescence and/or photosensitivity. The term "(meth)acrylic" is intended to mean acrylic, methacrylic or combinations. The term "(meth)acrylate" is intended to mean acrylate, methacrylate, or combinations. In addition, the IUPAC numbering system is used throughout, where the groups from the Periodic Table are numbered from left to right as 1 through 18 (CRC Handbook of Chemistry and Physics, $81^{st}$ Edition, 2000).

DESCRIPTION OF THE PREFERRED EMBODIMENTS

Figure 1:
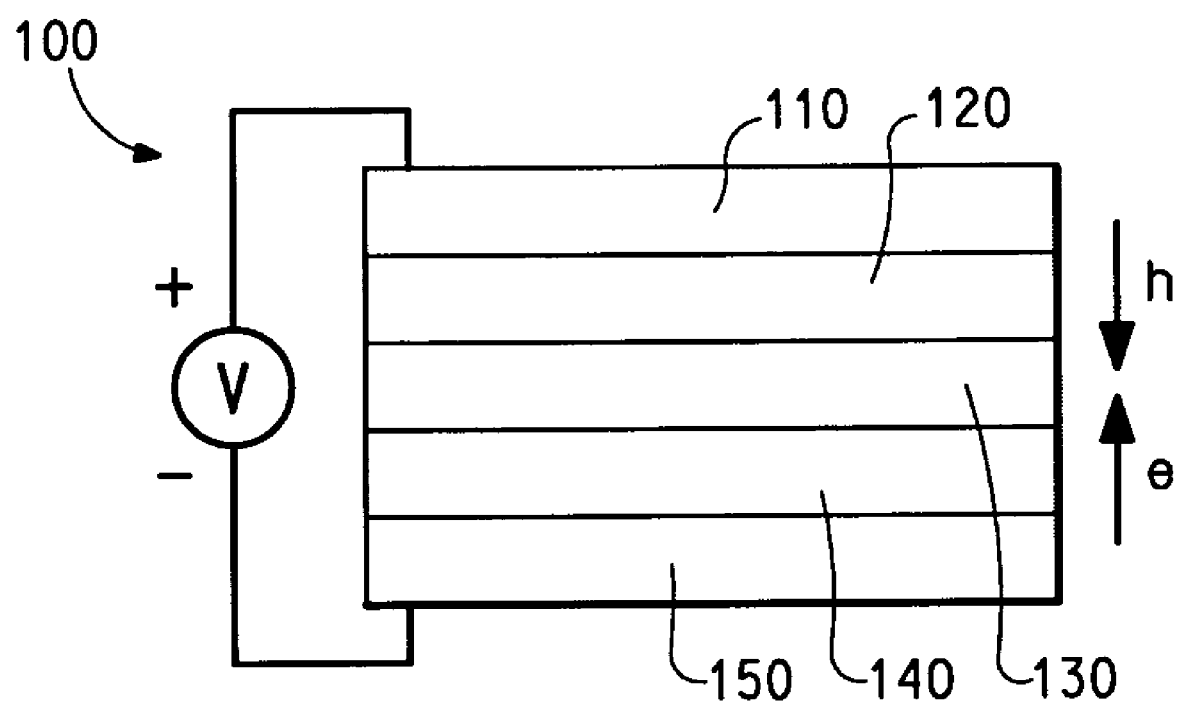
FIG. 1 is a schematic diagram of a light-emitting device (LED).

The at least one fused aromatic ring group of the substituents attached to the polymeric backbone generally has from 10 to 50 carbon atoms and contain from 2 to 8 fused aromatic rings, preferably 2 to 4. The fused aromatic ring group can optionally be substituted with alkyl or aryl groups having 1 to 20 carbon atoms. Examples of suitable fused aromatic ring groups include naphthyl, anthracyl, phenanthryl, phenalenyl, fluorenyl, pyrenyl, and other tetracenyl and pentacenyl groups. In accordance to the present invention, hole transport properties are achieved in the absence of groups which are generally used to provide hole transport properties, such as triarylamine groups and carbazole groups.

The hole transport polymers can be obtained by reacting a polymer having a first type of reactive group ("functionalized polymer") with a fused aromatic ring compound having a second type of reactive group ("functionalized fused aromatic ring compound"). This is shown schematically in Reaction (1) below.

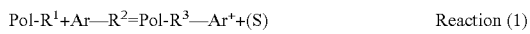

where Pol represents the polymeric backbone, Ar represents the fused aromatic ring, $R^1$ and $R^2$ represent the first type and second type of reactive groups, respectively, $R^3$ represents the linkage resulting from the reaction of $R^1$ and $R^2$, and S represents any byproducts which may be formed in the reaction.

Techniques for attaching small molecules to polymers are well-known, as in the coupling of biochemical ligands to latex particles. This is discussed in, for example, *Uniform Latex Particles*, by L. B. Bangs (Form # 1661-84 from Seragen Diagnostics, Inc., Indianapolis, Ind., 1984). For example, a polymer having carboxylic acid functional groups can be reacted with a fused aromatic ring compound having amino functional groups, forming an amide linkage. Alternatively, the carboxylic acid group can be on the fused aromatic ring and the amino group on the polymer. Similarly, hydroxyl groups react with acid chloride groups to form ester linkages. Other types of reactive pairs include hydroxyl and chloromethyl groups; hydroxyl and carboxylic acid groups; isocyanate and hydroxyl or amine groups; epoxy and amine groups; acid chloride and amine groups; sulfonic acid and amine groups; sulfonic acid chloride and hydroxyl groups; aldehyde and amino groups; aldehyde and carboxyl groups; aldehyde and hydroxyl groups; and aldehyde and methylketone groups. A variety of reactions that will provide linkages are available in the synthetic organic chemistry literature.

Alternatively, the hole transport polymer can be obtained by polymerizing at least one type of monomer having attached thereto a fused aromatic ring group ("functionalized monomer"), as shown in Reaction (2) below.

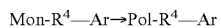    Reaction (2)

where Mon represents a polymerizable compound, $R^4$ represents a linking group, and Ar and Pol are as defined in Reaction (1) above.

I. Functionalized Polymer

The functionalized polymeric compounds that are useful in the present invention can be generally described as having: (a) a polymeric backbone; (b) a plurality of a first-type functional group; optionally (c) a spacer group between the polymeric backbone and the first-type functional group; and optionally (d) a plurality of second-type functional group(s) that are the same or different from each other. The polymeric backbone can be any polymer or copolymer having the desired properties and processability, and to which the fused aromatic ring groups can be attached. Some categories of useful polymeric backbones include polyacrylates; polymethacrylates; polyaramids; polystyrenes; polyarylenes; polyvinylenes; polyvinyl ethers; and polyvinyl esters.

The first-type functional groups useful for attaching the fused aromatic ring groups, are any of those discussed above as part of a reactive pair.

The number of fused aromatic groups on the polymeric backbone, which also can be described as the "density of fused aromatic groups", will affect the efficiency of the polymer as a hole transport material. However, when choosing the polymer, other factors should also be taken into consideration, such as processability and film forming capability. For the polymeric materials of the invention, the density of fused aromatic groups is determined by the relative proportion of monomers having first-type functional groups ("first-type functional monomers") to other monomers not having first-type functional groups in the polymer. In general, the ratio of first functional monomers to other monomers can be in the range of about 5:95 to 95:5.

The first-type functional group can be attached directly to the polymer backbone, as, for example, the carboxyl group of a polyacrylic acid polymer. However, it is also possible to have a spacer group between the first-type functional group and the polymeric backbone. Useful spacer groups are those that are chemically stable and do not deleteriously affect the transport properties of the polymer. The spacer group can be a saturated or unsaturated aliphatic group, or an aromatic group. The spacer group can contain heteroatoms, particularly oxygen and nitrogen. In some cases, a spacer group is present because the most readily available monomers for certain first functional groups have the spacer group. The spacer group generally has from 1 to 50 carbon atoms; preferably from 5 to 15 carbon atoms. The spacer group can simply provide distance between the polymer backbone and first functional group, or it can provide functionality, as discussed below.

The functionalized polymer can also have at least one second-type functional group. The second-type functional group can be present to modify the physical properties of the final polymer. Examples of such types of groups include plasticizing groups, such as alkylene oxide groups, and reactive and/or crosslinkable groups, such as terminal vinyl groups and epoxy groups. The second-type functional group can be present in the polymer backbone, in the spacer group attached to the first-type functional group, or in pendant groups separate from the first-type functional group.

The functionalized polymer can be made using monomer(s) having the desired functional group(s), using conventional polymerization techniques. Examples of suitable monomers include (meth)acrylic acid (carboxyl functionality); 4-styrenecarboxylic acid (carboxyl functionality); aminoalkyl acrylates and methacrylates (amino functionality); hydroxylalkyl (meth)acrylates (hydroxy funcationality); glycidyl (meth)acrylate (epoxy functionality); and similar monomers having the desired functional group.

The functionalized polymers can be a homopolymer or a copolymer. The copolymers can be prepared so that they are random, alternating, block, or comb copolymers. The process for forming these different structural copolymers are well known in the art, and have been discussed in, for example, *Principles Of Polymerization*, 3rd Edition, by George Odian (John Wiley & Sons, New York, N.Y., 1991); *Chemical Reactions of Natural and Synthetic Polymers*, by M. Lazar et al.; and *Chemical Reactions on Polymers*, by Benham and Kinstle (1988).

II. Functionalized Fused Aromatic Ring Compounds

Functionalized fused aromatic ring compounds have reactive groups capable of reacting with groups on the functionalized polymer, as discussed above. Useful types of functionalized fused aromatic ring compounds include aromatic amines, aromatic sulfonyl chlorides, aromatic isothiocyanates, aromatic succinimidyl esters, aromatic aldehydes, and aromatic alcohols or phenols. Some of these compounds are commercially available, such as 1-(1-naphthyl)ethylamine; 1-pyrenemethylamine; 1-pyrenepropylamine; 4'-(aminomethyl)fluorescein; rhodamine B ethylene diamine; rhodamine B sulfonyl chloride; and 5-dimethylaminonaphthylene-1-sulfonyl chloride. Other suitable functionalized fused aromatic ring compounds can be prepared using standard synthetic chemical techniques.

III. Functionalized Monomers

In general, functionalized monomers can be prepared by coupling the functional groups to monomers, using the same coupling chemistry as described above. When the hole transport polymer is prepared from functionalized monomers it is possible to get more structurally well-defined polymeric materials. The functionalized monomers can be polymerized using processes that result in different structures, such as block copolymers, alternating copolymers, comb polymers, and other known polymeric structures. When the hole transport polymer is prepared from a functionalized polymer and functionalized fused aromatic ring compound, the reactions occur in a more random, statistically controlled manner.

IV. Devices

The present invention also relates to an electronic device comprising an organic active layer sandwiched between two electrical contact layers, an anode and a cathode, wherein the device further comprises the hole transport polymer of the invention. A typical structure is shown in FIG. 1. The device 100 has an anode layer 110 and a cathode layer 150. Adjacent to the anode is an optional layer 120 comprising a hole transport material. Adjacent to the cathode is an optional layer 140 comprising an electron transport material. Between the anode and the cathode (or the optional charge transport layers) is the organic active layer 130. The hole transport polymer of the invention is present in the organic active layer 130, and/or in the hole transport layer 120. It is understood that each functional layer may be made up of more than one layer.

The device generally also includes a support, which can be adjacent to the anode or the cathode. Most frequently, the support is adjacent the anode. The support can be flexible or rigid, organic or inorganic. Generally, glass or flexible organic films are used as a support.

The anode 110 is an electrode that is particularly efficient for injecting or collecting positive charge carriers. It can be made of, for example materials containing a metal, mixed metal, alloy, metal oxide or mixed-metal oxide, or it can be a conducting polymer. Suitable metals include the Group 11 metals, the metals in Groups 4, 5, and 6, and the Groups 8-10 transition metals, as shown on the periodic table of elements (current IUPAC format). If the anode is to be light-transmitting, mixed-metal oxides of Groups 2, 3, 4, 13 and 14 metals, such as indium-tin-oxide. A conducting polymer, such as poly(3,4-ethylenedioxythiophene) (PEDOT), and polyaniline (PANI) can be used when the conductivity is greater than $10^{-2}$ S/cm. At least one of the anode and cathode should be at least partially transparent to allow the passage of light into or out from the active layer of the device.

Inorganic anode layers are usually applied by a physical vapor deposition process. The term "physical vapor deposition" refers to various deposition approaches carried out in vacuo. Thus, for example, physical vapor deposition includes all forms of sputtering, including ion beam sputtering, as well as all forms of vapor deposition such as e-beam evaporation. A specific form of physical vapor deposition which is useful is rf magnetron sputtering. The conductive polymer anode layers can be applied using any conventional means, including spin-coating, casting, and printing, such as gravure printing, ink jet printing or thermal patterning.

The hole transport polymer of the invention can be present as a separate layer 120, or in combination with the emitting material in layer 130. The polymer layer can be applied using any conventional application means, as described above. The polymer is generally applied as a solution or dispersion in organic solvents such as dimethyl sulfoxide, N-methyl pyrrolidone, dimethyl formamide, acetonitrile, propylene carbonate, propylene glycol monomethyl ether, dimethyl acetamide, and tetrahydrofuran. The concentration of the polymer in the solvent is not particularly critical, so long as the solution or dispersion can be coated to form a continuous film. In general, solutions or dispersion having 1 to 5% by weight of the polymer can be used.

In some cases it may be desirable to have an additional hole transport layer (not shown) made from other hole transport materials. Examples of other suitable hole transport materials for layer have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl) biphenyl]4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)4,4'-diamine (TTB); and porphyrinic compounds, such as copper phthalocyanine. Commonly used hole transporting polymers are polyvinylcarbazole (PVK) and (phenylmethyl) polysilane. Conductive polymers such as poly(3,4-ethylenedioxythiophene) (PEDOT), and polyaniline (PANI), can be used when the conductivity is below $10^{-2}$ S/cm. It is also possible to obtain hole transporting polymers by doping hole transporting molecules such as those mentioned above into polymers such as polystyrene and polycarbonate. These materials can be applied by conventional coating or vapor deposition techniques.

In many cases, the anode and the hole transport layer are patterned. It is understood that the pattern may vary as desired. The layers can be applied in a pattern by, for example, positioning a patterned mask or photoresist on the first flexible composite barrier structure prior to applying the first electrical contact layer material. Alternatively, the layers can be applied as an overall layer and subsequently patterned using, for example, a photoresist and wet chemical etching. As discussed above, the conductive polymer layer can also be applied in a pattern by ink jet printing, lithography, screen printing, or thermal transfer patterning. Other processes for patterning that are well known in the art can also be used.

Depending upon the application of the device 100, the active layer 130 can be a light-emitting layer that is activated by an applied voltage (such as in a light-emitting diode or an illumination device), a layer of material that responds to radiant energy and generates a signal with or without an applied bias voltage (such as in a photodetector), or a layer that converts radiant energy into electrical energy, such as a photovoltaic cell or solar cell. Examples of electrical devices include photoconductive cells, photoresistors, photoswitches, phototransistors, and phototubes, and photovoltaic cells, as these terms are describe in Markus, John, *Electronics and Nucleonics Dictionary*, 470 and 476 (McGraw-Hill, Inc. 1966).

Where the active layer is light-emitting, the layer will emit light when sufficient bias voltage is applied to the electrical contact layers. The light-emitting active layer may contain any organic electroluminescent or other organic light-emitting materials. Such materials can be small molecule materials such as those described in, for example, Tang, U.S. Pat. No. 4,356,429, Van Slyke et al., U.S. Pat. No. 4,539,507, the relevant portions of which are incorporated herein by reference. The light-emitting materials can be organo-metallic complexes, as described in, for example, published US application U.S. 2001/0019782 and published PCT applications WO 00/70655 and WO 01/41512. Alternatively, such materials can be polymeric materials such as those described in Friend et al. (U.S. Pat. No. 5,247,190), Heeger et al. (U.S. Pat. No. 5,408,109), Nakano et al. (U.S. Pat. No. 5,317,169), the relevant portions of which are incorporated herein by reference. Preferred electroluminescent materials are semiconductive conjugated polymers. An example of such a polymer is poly(p-phenylenevinylene) referred to as PPV.

The light-emitting materials may form a layer alone, or they may be dispersed in a matrix of another material, or may be combined with the hole transport polymer of the invention. The concentration of the charge transport material has to be above the percolation threshold of approximately 15 volume %, such that a conducting pathway can be established. When the density of the material is close to one, 15 wt % is acceptable as long as the percolation threshold is reached. The hole transport polymer of the invention is generally present in an amount of about 15 to 99% by weight, based on the total weight of the emitting layer, preferably 25 to 80% by weight.

The active organic layer generally has a thickness in the range of 50-500 nm.

Where the active layer is incorporated in a photodetector, the layer responds to radiant energy and produces a signal either with or without a biased voltage. Materials that respond to radiant energy and is capable of generating a signal with a biased voltage (such as in the case of a photoconductive cells, photoresistors, photoswitches, phototransistors, phototubes) include, for example, many conjugated polymers and electroluminescent materials. Materials that respond to radiant energy and is capable of generating a signal without a biased voltage (such as in the case of a photoconductive cell or a photovoltaic cell) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, *Journal of Electronic Materials*, Vol. 23, pp 925-928 (1994); and MEH-PPV Composites with CN-PPV ("Efficient Photodiodes from Interpenetrating Polymer Networks", J. J. M. Halls et al. (Cambridge group) *Nature* Vol. 376, pp. 498-500, 1995).

The active layer 130 containing the active organic material can be applied from solutions by any conventional means, including spin-coating, casting, and printing. The active organic materials can be applied directly by vapor deposition processes, depending upon the nature of the materials. It is also possible to apply an active polymer precursor and then convert to the polymer, typically by heating.

The cathode 150 is an electrode that is particularly efficient for injecting or collecting electrons or negative charge carriers. The cathode can be any metal or nonmetal having a lower work function than the first electrical contact layer (in this case, an anode). Materials for the second electrical contact layer can be selected from alkali metals of Group 1 (e.g., Li, Cs), the Group 2 (alkaline earth) metals, the Group 12 metals, the rare earths, the lanthanides, and the actinides. Materials such as aluminum, indium, calcium, barium, and magnesium, as well as combinations, can be used. Li-containing organometallic compounds can also be deposited between the organic layer and the cathode layer to lower the operating voltage.

The cathode layer is usually applied by a physical vapor deposition process. In general, the cathode layer will be patterned, as discussed above in reference to the anode layer 110 and conductive polymer layer 120. Similar processing techniques can be used to pattern the cathode layer.

Option al layer 140 can function both to facilitate electron transport, and also serve as a buffer layer or confinement layer to prevent quenching reactions at layer interfaces. Preferably, this layer promotes electron mobility and reduces quenching reactions. Examples of electron transport materials for optional layer 140 include metal chelated oxinoid compounds, such as tris(8-hydroxyquinolato)aluminum ($Alq_3$); cyclometallated iridium complexes with phenyl-pyridine ligands having fluorine-containing substituents, such as those disclosed in copending application Ser. No. 09/879,014; phenanthroline-based compounds, such as 2,9-dimethyl-4,7-diphenyl-1, 10-phenanthroline (DDPA) or 4,7-diphenyl-1, 10-phenanthroline (DPA); and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1, 2,4-triazole (TAZ).

Optional layer 140 can also be made with polymeric materials. Examples include poly(fluorene-oxadiazole), as disclosed in copending application Ser. No. 09/546,512, and some polyphenylenevinylene polymers (PPV), such as cyano-substituted PPV.

It is known to have other layers in organic electronic devices. For example, there can be a layer (not shown) between the conductive polymer layer 120 and the active layer 130 to facilitate positive charge transport and/or band-gap matching of the layers, or to function as a protective layer. Similarly, there can be additional layers (not shown) between the active layer 130 and the cathode layer 150 to facilitate negative charge transport and/or band-gap matching between the layers, or to function as a protective layer. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers is preferably determined by balancing the goals of providing a device with high device efficiency.

The device can be prepared by sequentially depositing the individual layers on a suitable substrate. Substrates such as glass and polymeric films can be used. In most cases the anode is applied to the substrate and the layers are built up from there. However, it is possible to first apply the cathode to a substrate and add the layers in the reverse order. In general, the different layers will have the following range of thicknesses: inorganic anode 110, 500-5000 Å, preferably 1000-2000 Å; optional hole transport layer 120, 50-2500 Å, preferably 200-2000 Å; photoactive layer 130, 10-1000 Å, preferably 100-800 Å; optional electron transport layer 140, 50-1000 Å, preferably 200-800 Å; cathode 150, 200-10000 Å, preferably 300-5000 Å.

EXAMPLES

The following examples illustrate certain features and advantages of the present invention. They are intended to be illustrative of the invention, but not limiting. All percentages are by weight, unless otherwise indicated.

Examples 1-2

These examples illustrate the formation of a functionalized polymer.

Materials

CN-PPV is a cyano-derivative of poly(phenylene-vinylene). It is similar to that described in Gang Yu and Alan J. Heeger, J. Applied Physics 78, 4510 (1995).

Green PPV and other PPVs are derivatives of poly(phenylene-vinylene) similar to those described in D. M. Johansson, G. Srdanov, G. Yu, M. Theander, O. Inganas and M. R. Andersson, "Synthesis and Characterization of Highly Soluble Phenyl-Substituted Poly(p-phenylenevinylene)", *Macromolecules* 33, 2525 (2000).

C60 is a fullerene molecule, which was purchased from BuckyUSA Inc., Florida. PCBM[6,6] is a fullerene derivative with functional side chain, which was synthesized following the procedure published in Iterature [J. C. Hummelen, B. W. Knight, F. Lepec, and F. Wudl, *J. Org. Chem.* 60, 532 (1995)]. Details on its physical properties can be found in N. S. Sariciftci and A. J. Heeger, *Intem. J. Mod. Phys.* B 8, 237 (1994).

PFO is a poly(fluorene-oxadiazole), which was prepared from the fluorene-dicarboxylic acid, as follows:

Synthesis of
9,9-di-(2-ethylhexyl)-fluorene-2,7-dicarboxylic Acid 7 g of magnesium was placed in a 500 ml flask and preheated to 100° C. under dry nitrogen. 5 mg of iodine was added, followed by the first part of a solution (20 ml) of 50 g of 2,7-dibromo-9,9-di-(2-ethylhexyl)-fluorene in 100 ml of dry THF. After the reaction was initialized (as indicated by the disappearance of color from the solution), the remainder of the solution was added dropwise with a syringe. After the addition, the reaction mixture was refluxed for 1 hour and an additional 100 ml of dry THF was added. The reaction mixture was then cooled to room temperature. 500 g of dry ice was added to the reaction mixture, and the flask was shaken until the dry ice was well mixed. After the excess amount of dry ice had evaporated, 800 ml of 18% hydrochloric acid was added to the residue. The acidified residue was extracted three times by ethyl acetate (3×200 ml). The organic layers were combined and washed with 400 ml water and then dried over MgSO$_4$. After evaporation of the solvents, 200 ml of hexane was added. The product precipitated as a white solid which was isolated by filtration. Further purification by recrystallization from methanol afforded 25 g of product as a white solid. The yield of product was 57%.

Proton NMR verified the following structure:

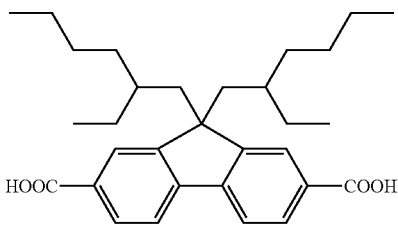

$^1$H-NMR (500 MHz, THF-d$_8$) δ in ppm: 8.17 (t, J=6.5 Hz, 2H, fluorene ring), 8.06 (d, 2H, J=8 Hz, fluorene ring), 7.89 (d, J=8 Hz, 2H, fluorene ring), 2.13 (d, J=5 Hz, 4H, H-alkyl), 0.65-0.95 (m, 22H, H-alkyl), 0.45-0.54 (m, 8H, H-alkyl).

Synthesis of
poly(9,9-di-(2-ethylhexyl)-fluorene-oxadiazole)

3.0 g of phosphorus pentoxide was dissolved in 50 ml of methylsulfuric acid with stirring in 110° C. oil heating bath under the protection of nitrogen. A mixture of 2.0 g of 9,9-di-(2-ethylhexyl)-fluorene-2,7-dicarboxylic acid and 286 mg of hydrazine hydrochloride was added to the solution. The suspension was stirred over 5 hours and a homogenous, viscous solution was formed. After the solution had cooled to room temperature, the solution was poured into 500 ml of water. The polymer was precipitated as a white fiber which was isolated by filtration. The crude polymer was washed by an aqueous solution of sodium carbonate, then water, then methanol, and dried at room temperature in vacuo. The crude polymer was dissolved in 25 ml of THF. The solution was filtered through a 5 μm filter, and the polymer was then precipitated from water. The polymer was isolated and washed by water, then methanol, and vacuum dried at room temperature. This purification process was repeated three times and afforded the polymer as a white fiber. The yield of the product was 1.5 g (78%).

Proton NMR verified the following structure:

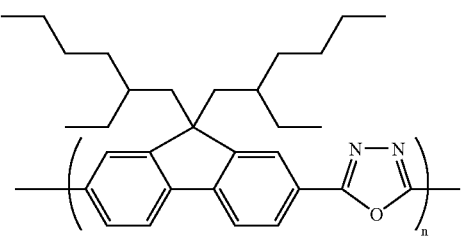

$^1$H-NMR (500 MHz, THF-d$_8$) δ in ppm: 8.42 (s, 2H, fluorene ring), 8.26 (d, 2H, fluorene ring), 8.13 (d, J=8 Hz, 2H, fluorene ring), 2.2-2.5 (br, 4H, H-alkyl), 0.8-1.1 (br, 16H, H-alkyl), 0.59-0.65 (br, 14H, H-alkyl).

Example 1

An amine functionalized acrylic copolymer to be used for subsequent attachment of fused aromatic compounds for the hole transport was prepared using the following procedure:

To a clean reaction vessel were added:

| Step I | Amount (grams) |
|---|---|
| Isobutyl methacrylate (IBMA) | 21.81 |
| 2-(Tertiarybutylamino) Ethyl Methacrylate(IBAEMA) | 18.94 |
| Acetone | 250.25 |

The resulting solution was heated to reflux temperature and held there, with stirring.

The following two solutions, previously mixed for 15 minutes under nitrogen, were then simultaneously added:

| Step II - Solution (A) | Amount (grams) |
|---|---|
| Acetone | 176.63 |
| Vazo ® 52 catalyst 2,2'-azobis(2,4-dimethylpentane nitrile) | 14.78 |

| Step III - Solution (B) | |
|---|---|
| Isobutyl methacrylate (IBMA) | 196.24 |
| 2-(Tertiarybutylamino) Ethyl Methacrylate (IBAEMA) | 170.46 |

Solution (A) was fed so that 54.8% was added over a 90 minute period and 45.2% over a 330 minute period; solution (B) was fed so that 67% was added over a 120 minute period and 33% over a 120 minute period. After feeds were completed, the reaction mass was held at reflux temperature with stirring for 120 minutes. A portion of the polymer solution (250 grams) was dried in a vacuum oven overnight after evaporating most of the solvent using nitrogen sweep. The polymer yield of IBMA/IBAEMA was 100%.

Example 2

An hydroxyl functionalized acrylic copolymer to be used for subsequent attachment of fused aromatic compounds for the hole transport was prepared using the following procedure:

To a clean reaction vessel were added:

| Step I | Amount (grams) |
|---|---|
| Acetone | 600.0 |

The resulting solution was heated to reflux temperature and held there, with stirring.

The following two solutions, previously mixed for 15 minutes under nitrogen, were then simultaneously added:

| Step II - Solution (A) | Amount (grams) |
|---|---|
| Acetone | 176.63 |
| Vazo ® 52 catalyst 2,2'-azobis(2,4-dimethylpentane nitrile) | 4.5 |

| Step III - Solution (B) | |
|---|---|
| Methyl Methacrylate (MMA) | 540.0 |
| 2-Hydroxyethyl Methacrylate (HEMA) | 180.0 |

Solution (A) and (B) were fed uniformly for 330 minutes and 240 minutes respectively. After feeds were completed, the reaction mass was held at reflux temperature with stirring for 60 minutes. A portion of the polymer solution (250 grams) was dried in a vacuum oven overnight after evaporating most of the solvent using nitrogen sweep. The polymer yield of HEMA/MMA was 100%. The molecular weight was measured by GPC. The number average (Mn), and the weight average molecular weight were 30,308 and 93,195 respectively, to give polydispersity (Pd) of 3.07.

Examples 3-4

These examples illustrate the attachment of a fused aromatic ring to a functionalized polymer.

Example 3

This example illustrates the attachment of a naphthyl ring to the functionalized polymer of Example 2.

To a clean, oven dried reaction vessel were added:

| Step 1 | Amount (grams) |
|---|---|
| HEMA/MMA copolymer from Example 2 | 20.0 |
| Tetrahydrofuran (THF), anhydrous | 444.5 |

The resulting solution was stirred at room temperature under argon until the polymer was completely dissolved.

The following reagent was next added in a single portion:

| Step 2 | Amount (grams) |
|---|---|
| 1,1'-Carbonyldiimidazole (CDI) | 7.50 |

The resulting solution was stirred at room temperature under argon for one hour.

The following solution was then added in dropwise fashion over 20 minutes:

| Step 3 | Amount (grams) |
|---|---|
| 1-(1-Naphthyl)ethylamine | 7.90 |
| Tetrahydrofuran (THF), anhydrous | 66.7 |

The resulting solution was stirred at room temperature under argon for 48 hours. The solution was then concentrated in vacuo to ⅓ of its original volume. The concentrated solution was poured into a large volume of water (200 ml) and the resulting precipitate was collected by filtration. The crude polymer product was extracted five times with water (200 ml) in a blender and was then oven dried in vacuo at 50° C. for 48 hours. Polymer yield was 84% by weight.

The polymer was characterized as having the Formula I below:

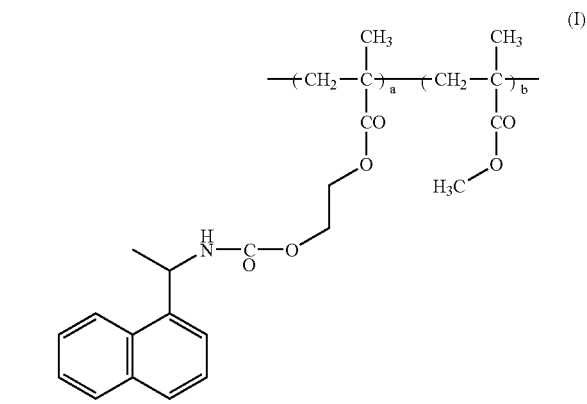

random copolymer: a = 25 mol %; b = 75 mol %

$^1$H NMR (DMSO-$d_6$): δ=6.7-8.1 (aromatic protons for pendant naphthylene group); ratio of aromatic H:aliphatic H=0.20 (theoretical=0.19); UV-vis (DMSO): λ max=305 nm.

The polymer molecular weight was not measured, as it should be very similar to that of the unmodified polymer.

Example 4

This example illustrates the attachment of a pyrene group to the functionalized polymer of Example 1.

To a clean, oven dried reaction vessel were added:

| Step 1 | Amount (grams) |
| --- | --- |
| 1-Pyrenecarboxylic acid | 2.25 |
| Thionyl chloride | 90.2 |

The resulting solution was heated to reflux for two hours. The remaining thionyl chloride was then removed by distillation giving a crude yellow solid. The solid was washed repeatedly with dry hexanes and then dried in vacuo at 50° C. for 12 hours. Yield of 1-pyrenecarbonyl chloride was 95%.

To a second clean, oven dried reaction vessel were added:

| Step 2 | Amount (grams) |
| --- | --- |
| IBMA/IBAEMA copolymer from Example 1 | 10.0 |
| Tetrahydrofuran (THF), anhydrous | 147.8 |

The polymer solution was stirred at room temperature under argon until the polymer was completely dissolved. The product prepared from Step 1 was then added.

The resulting solution was stirred under argon for 12 hours at room temperature. The solution was further modified:

| Step 3 | Amount (grams) |
| --- | --- |
| Triethylamine | 2.93 |

The resulting solution was stirred under argon for 5 minutes. The solution was further modified:

| Step 4 | Amount (grams) |
| --- | --- |
| Cyclohexanoyl chloride | 2.26 |

The resulting solution was stirred at room temperature under argon for 12 hours. The solution was then concentrated in vacuo to ½ of its original volume. The concentrated solution was poured into a large volume of water (300 mL) and the resulting precipitate was collected by filtration. The crude polymer product was extracted five times with water (200 mL) in a blender and was then oven dried in vacuo at 50° C. for 48 hours. Polymer yield was 79% by weight.

UV-vis (DMSO): λ max=340 nm

The polymer molecular weight was not measured as it should be very similar to that of the unmodified polymer.

Example 5

This example illustrates the preparation of a hole transport of the invention from functionalized monomers.

A polyaramide having pendant pyrene groups to be employed as a hole transport material was prepared in a multi-step manner as follows:

To a clean, oven dried reaction vessel were added:

| Step 1 | Amount (grams) |
| --- | --- |
| 1-Pyrenecarboxylic acid | 4.07 |
| Thionyl chloride | 163.1 |

The resulting solution was heated to reflux for two hours. The remaining thionyl chloride was then removed by distillation giving a crude yellow solid. The solid was washed repeatedly with dry hexanes and then dried in vacuo at 50° C. for 12 hours. Yield of 1-pyrenecarbonyl chloride was 95%.

The 1-pyrenecarbonyl chloride was further modified. To a clean, oven dried reaction vessel were added:

| Step 2 | Amount (grams) |
| --- | --- |
| 5-Aminoisophthalic acid | 3.03 |
| N,N-Dimethylacetamide (DMAC) | 93.7 |

The resulting solution was stirred at room temperature under argon. The following solution, previously mixed for 5 minutes under argon, was then added dropwise over 15 minutes:

| Step 3 | Amount (grams) |
| --- | --- |
| 1-Pyrenecarbonyl chloride | 4.16 |
| N,N-Dimethylacetamide (DMAC) | 46.9 |

The resulting solution was stirred at room temperature under argon for eight hours. The DMAC solvent was then removed by vacuum distillation, giving a crude tan solid. The solid was twice washed in methanol and then dried in vacuo at 50° C. for 24 hours. Product yield was 92%.

The product isolated from Step 3 was further modified using a pyrene diacid having Formula II, below.

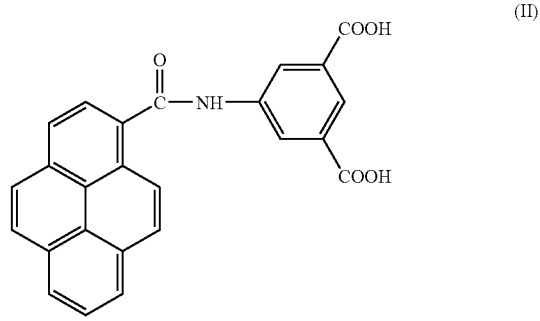

(II)

To a clean, oven dried reaction vessel was added:

| Step 4 | Amount (grams) |
| --- | --- |
| Compound of Formula I | 4.50 |
| Thionyl chloride | 326.2 |

The resulting solution was heated to reflux for 12 hours. The remaining thionyl chloride was then removed by distillation giving a crude yellow-green solid, having Formula III below.

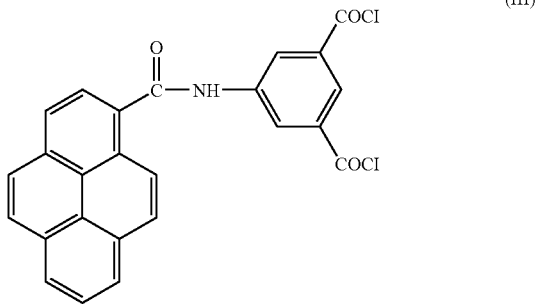

(III)

The solid was washed repeatedly with dry hexanes and then dried in vacuo at 50° C. for 12 hours.

The pyrene-diacid chloride of Formula II was then used to make the hole transport polymer. To a clean, oven dried reaction vessel was added:

| Step 5 | Amount (grams) |
| --- | --- |
| Compound of Formula II | 2.0 |
| 1,3-Phenylenediamine | 0.47 |
| N,N-Dimethylacetamide (DMAC) | 37.5 |

The resulting solution was stirred at room temperature under argon for 12 hours. The solution was then poured in water giving a yellow-tan precipitate. The precipitate was collected and extracted with methanol. The resulting polyaramide was dried in vacuo at 50° C. for 48 hours. Polymer yield was 81% by weight.

The polymer was characterized as having Formula IV below:

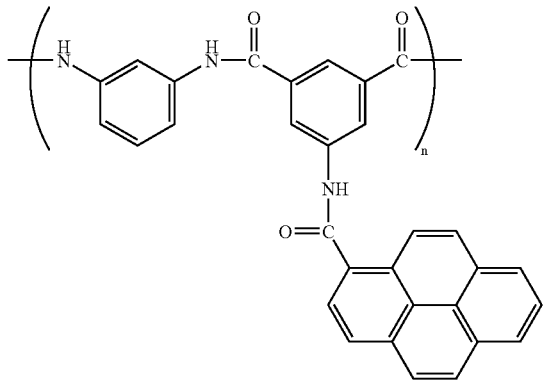

$^1$H NMR (DMSO-$d_6$): δ=11.1-11.3 (m, 1H); 10.6-10.7 (s, 2H); 7.9-8.7 (m 16H). UV-vis (DMSO): λ max=345 nm. Inherent viscosity (0.5 wt %, $H_2SO_4$, 25° C.)=0.61 dL/g.

Example 6-12

These examples illustrate the use of the polymers of the invention in two-terminal, thin film devices.

Example 6

The polymer layer was sandwiched between two conductive electrodes made of inorganic metals or organic conductive polymers. One set of devices was made as follows. A 1000 Å gold layer was thermally evaporated onto glass substrates. A conductive layer of poly(3,4-ethylenedioxythiophene) (PEDOT) was then coated on top. The Au/PEDOT layer formed the anode 110 of this device. Polymer from Example 5 was coated from 2% solution in dimethylacetamide (DMAC) filtered through a 0.45μ pp filter. The thickness of resulting film was ~500 Å, which was measured by a TENCOR 500 Surface Profiler. The cathode electrode was a Ba(30 Å)/Al(3000 Å) bilayer structure, which was vapor deposited on top of the active layers under a vacuum of about $3\times10^{-6}$ torr. The active area of the device was defined by the two electrodes, and was ~0.15 $cm^2$ in this experiment. Device performance was tested inside a dry box using a Keithley 236 Source-Measure-Unit.

Figure 2:
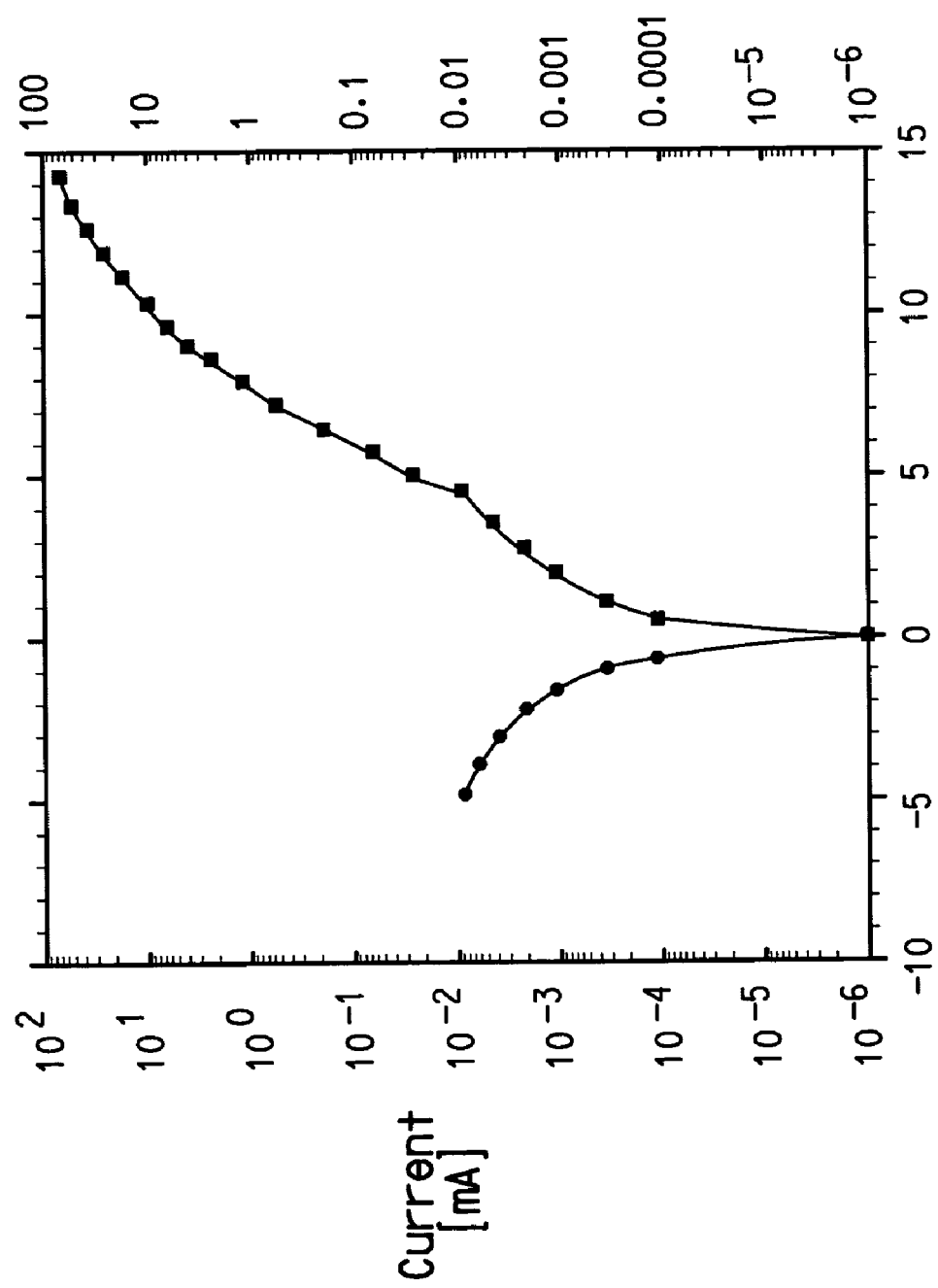
FIG. 2 is a current vs voltage curve for the device of Example 5.

The current vs voltage (IV) characteristics are shown in FIG. 2. This two-terminal device had a good rectification effect. Curve (200) plots the current when a reverse bias is applied, while curve (210) plots the current when a forward bias is applied. At a forward bias of 15 V, the forward current was 50 mA (330 mA/$cm^2$), 5000 times higher than the current under ~5 V bias. Such a device can be used as an electric switch. When the "ON" state is defined at 14 V bias, and the "OFF" state at zero bias, the switch ratio ($I_{on}/I_{off}$) is larger than $10^7$.

Similar devices were prepared using Au, Pt, Ag, Ni, Cu, Se, polyaniline (PANI), and polypyrrole as the anode electrode. Similar results were observed. Similar devices were prepared using Ba, Li, Ce, Cs, Eu, Rb, Sm Al, In, LiF/Al, BaO/Al and CsF/Al as the cathode electrode, and similar I-V characteristics were observed.

This example demonstrates that the polymers disclosed in this invention can be used to fabricate two-terminal, thin film devices with good rectification effect. Such devices can be used as solid state electric switches.

Example 7

Devices were fabricated with the same material and with a similar procedure as given in Example 6. In this case, the cathode and anode electrode were patterned with shadow masks. 10×10 diode arrays were fabricated. The pitch size of each pixel was 0.3 mm, which was defined by the widths of two contact electrodes. The I-V characteristics of each pixel were analyzed, and behavior similar to that shown in FIG. 1 was observed.

This example demonstrated that the polymers disclosed in this invention can be used to fabricate microswitch arrays.

Example 8

Devices were fabricated using a procedure similar to that given in Example 6. In this case, the active polymer was the polymer from Example 3. THF was used as the solvent. The I-V characteristics were similar to that of Example 6. The device forward current reached 330 mA/$cm^2$ at ~20 V.

This example, as well as Example 6, demonstrates that the polymers of the invention can be used as the active layer for two-terminal switching devices.

Example 9

Thin film light emitting devices were fabricated following the procedure described in Example 6. In these devices, a transparent ITO electrode was used as the anode (Layer 110 as best seen in FIG. 1). A layer of poly(vinylcarbazole) was used as the hole transport layer (Layer 120 as best seen in FIG. 1). On top of this layer, the polymer from Example 4 was applied as the EL layer (Layer 130 as best seen in FIG. 1). It was spin coated from THF solution, using a procedure similar to that described in Example 8. The resulting thickness of the film was about 950 Å. Ba and Al layers were vapor deposited on top of the EL layer under a vacuum of about $3\times10^{-6}$ torr. The thicknesses of the Ba and Al layers were 30 Å and 3000 Å respectively. Device performance was tested inside a dry box using a calibrated Si photodiode and a Keithley 236 Source-Measure-Unit.

Figure 3:
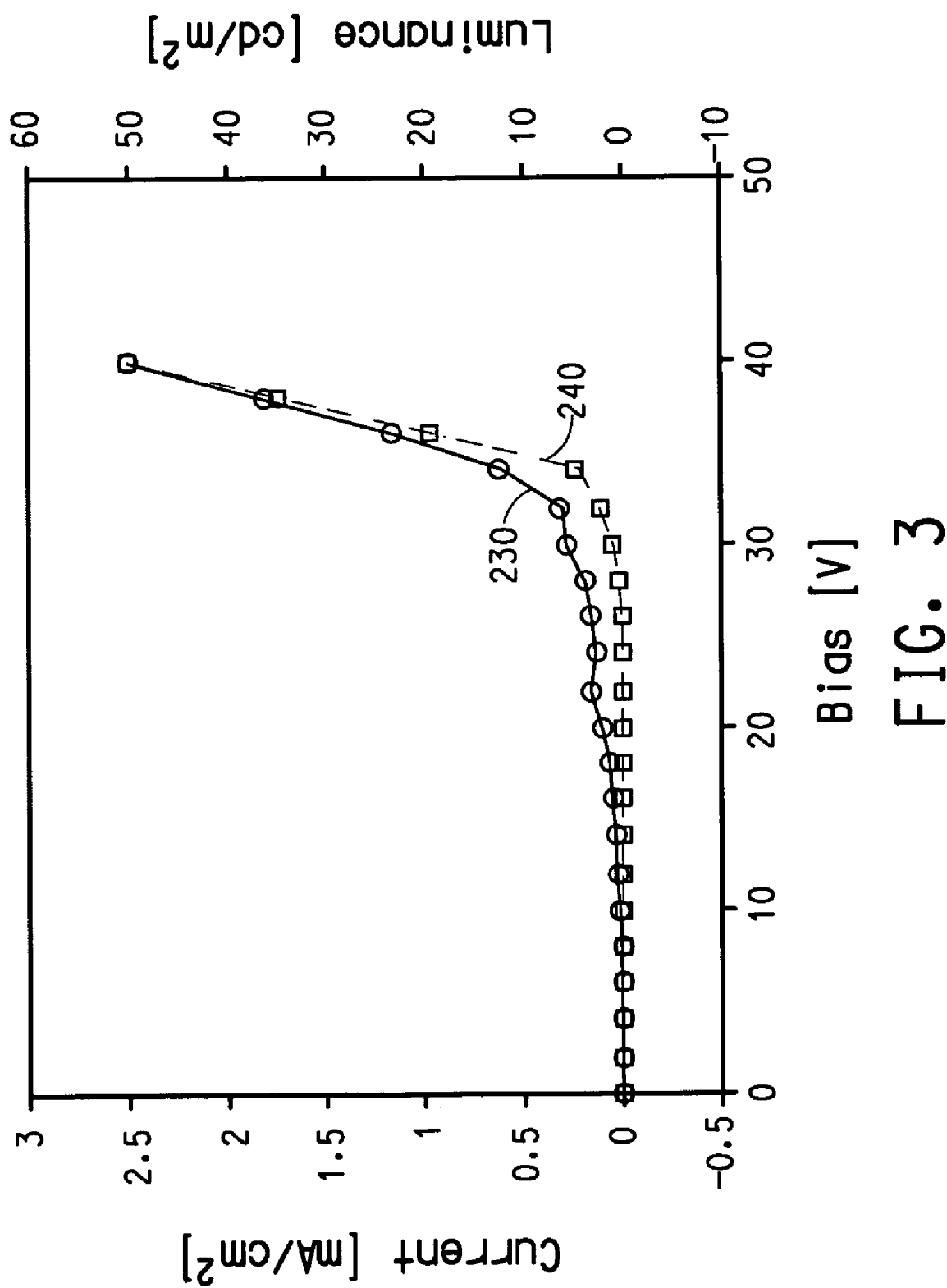
FIG. 3 is a current vs voltage curve and a light-emission vs voltage curve for the device of Example 9.

FIG. 3 shows the current versus voltage ("I-V") (curve 230) and light emission versus voltage ("L-V") (curve 240) characteristics of this device. Blue light emission was observed in forward bias. The emission was ~50 cd/M² at 40V. The external quantum efficiency was 0.2% ph/el in a broad voltage range. EL emission spectrum revealed that the emission was from the polymer disclosed in Example 4 (by comparison with the photoluminescent spectrum of the same material.

Devices were also fabricated in similar configuration but with a PEDOT layer (~1000 Å) in between ITO and PVK layer. The performance parameters of these devices are similar to that shown in FIG. 3.

This example demonstrated that the polymers disclosed in this invention can be used as the light emitting material in polymer light emitting devices.

Example 10

Thin film light-emitting devices were fabricated following the procedure described in Example 9. In these devices, ITO was used as the anode (Layer 110). A layer of polymer from Example 5 was used as the hole transport layer (120). Over the hole transport layer, ~1000 Å poly(fluorene-oxadiazole) (PFO) was spin-coated (layer 130). Ca/Al was used as the cathode electrode (150). Blue light emission characteristic of PFO was observed with an external quantum efficiency ~1% ph/el. The CIE color coordinates were x=0.18, y=0.15, which was close to the numbers recommended by the CIE for color display applications. These devices could be operated at low bias voltage. Light emission was typically observed above 4 volt, reaching ~100 cd/m² at ~8 V and over $10^3$ cd/m² at 10V.

The procedure was repeated with a poly(phenylene vinylene) derivative with alkyl side chains as the layer 130. Green light emission was observed for voltages larger than 4V with EL efficiency of 5-10 cd/A.

The procedure was repeated with a poly(phenylene vinylene) derivative with alkoxy side chains as layer 130. Orange-red light emission was observed for voltages larger than 4 V, with an EL efficiency of 2-3 cd/A.

This example demonstrates that the polymers disclosed in this invention can be used as the hole transport materials for blue, green and red light emitting devices. Such devices can be used as the pixels in full-color emissive displays.

Comparative Example A

Experiments were carried out following the same procedure as described in Example 10, but using PVK (Sigma-Aldrich, Milwaukee, Wis.) as the hole transport layer (120). Results similar to those described in Example 10 (with a hole transport polymer disclosed in this invention) were observed.

This example, along with example 10, demonstrates that the polymers disclosed in this invention can be used as the hole transport materials for blue, green and red light emitting devices. Such devices can be used as the pixels in full-color emissive displays.

Example 11

Thin film devices were fabricated in configuration of ITO/ polymer from Example 5 (100 nm)/Ba (3 nm)/Al (100 nm). The current voltage characteristic under white lamp illumination was measured. A photovoltaic effect was observed under UV illumination. The open circuit voltage was ~2V. The photosensitivity at 336 nm was approximately 1 mA/Watt.

This example demonstrates that the polymers disclosed in this invention can be used to fabricate photodetectors for ultraviolet light detection.

Example 12

The procedure of Example 11 was repeated, but with an active layer made of polymer blends containing the polymers of Examples 3 and 5, and an additional polymer or molecule with a smaller optical energy gap. The photoresponse was measured for these devices. The table below provides the range of spectral response obtained from this blend.

| Additive | Spectral range |
| --- | --- |
| PFO | 400 nm |
| Green PPV derivative | 500 nm |
| CN-PPV | 600 nm |
| C60, PCBM[6,6] | 710 nm |

This example demonstrates that the polymers disclosed in this invention can be used as host materials for the fabrication of photodetectors with different spectral response ranges. Blends with response to near infrared or infrared spectral range are also suitable for energy conversion devices such as solar cells.

What is claimed is:

1. An organic electronic device comprising an active layer between an anode and a cathode, wherein the device further comprises at least one hole-transporting polymer, comprising a polymeric backbone having linked thereto a plurality of substituents comprising fused aromatic ring groups with the proviso that the polymer does not contain groups selected from triarylamines and carbazole groups, and wherein the polymeric backbone is selected from polyacrylates, polymethacrylates, polyamides, polystyrenes, polyarylenes, polyesters, polyvinylenes, polyvinyl ethers and polyvinyl esters, wherein the hole-transporting polymer has the formula Pol-R³—Ar, where Pol represents the polymeric backbone, Ar represents the fused aromatic ring, and R³ represents a linkage resulting from the reaction of a first type reactive group and a second type reactive group, wherein the first type and second type reactive groups are selected from the group consisting of carboxylic acid and amino groups; hydroxyl and acid chloride groups; hydroxyl and carboxylic acid groups; isocyanate and hydroxyl groups; isocyanate and amine groups; epoxy and amine groups; acid chloride and amine groups; sulfonic acid and amine groups; sulfonic acid chloride and hydroxyl groups; aldehyde and amino groups; aldehyde and carboxyl groups; aldehyde and hydroxyl groups; and aldehyde and methylketone groups.

2. The device of claim 1 wherein the device is a light-emitting device.

3. The device of claim 1 wherein the device is a photodetector.

4. The device of claim 1 wherein the device is a photovoltaic cell.

5. The device of claim 1 wherein the fused aromatic ring groups are selected from naphthyl, anthracyl, phenanthryl, phenalenyl, fluorenyl, pyrenyl, tetracenyl and pentacenyl groups.

6. An organic electronic device comprising an active layer between an anode and a cathode, wherein the device further comprises at least one hole-transporting polymer, and wherein the hole transport polymer has a formula selected from,
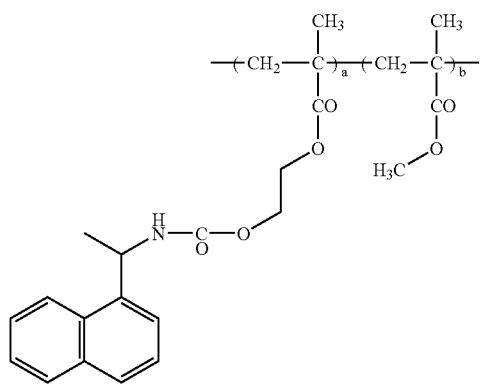
(I)
random copolymer: a = 25 mol%; b = 75 mol%
and
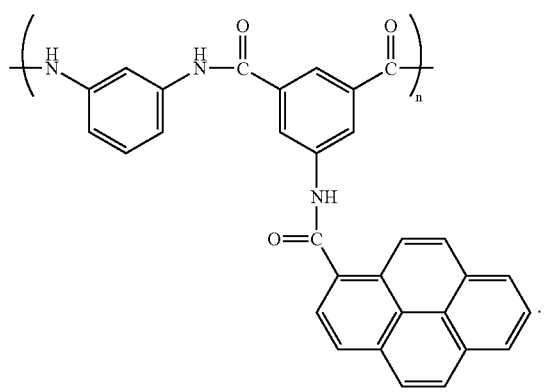
7. The device of claim 1 wherein the linkage is an amide linkage or an ester linkage.
* * * * *